United States Patent
Brown et al.

(10) Patent No.: US 6,544,599 B1
(45) Date of Patent: *Apr. 8, 2003

(54) PROCESS AND APPARATUS FOR APPLYING CHARGED PARTICLES TO A SUBSTRATE, PROCESS FOR FORMING A LAYER ON A SUBSTRATE, PRODUCTS MADE THEREFROM

(76) Inventors: William D. Brown, 2407 Sweetbriar, Fayetteville, AR (US) 72703; Rajan A. Beera, 3405 Willowood Cir., Apt. #2033, Arlington, TX (US) 76015; Ajay P. Malshe, 1558 Dawn Dr., Fayetteville, AR (US) 72702; Hameed A. Naseem, 2138 Loren Cir., Fayetteville, AR (US) 72701

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/688,957

(22) Filed: Jul. 31, 1996

(51) Int. Cl.[7] ................................................. B05D 1/04
(52) U.S. Cl. .................. 427/475; 427/383.1; 427/397.7
(58) Field of Search ................................ 427/457, 474, 427/475, 476, 477, 479, 480, 483, 62, 383.1, 397.7, 249.12, 249.14, 249.15, 249.17

(56) References Cited

U.S. PATENT DOCUMENTS

| | | | | |
|---|---|---|---|---|
| 5,034,372 A | * | 7/1991 | Matsuno et al. | |
| 5,073,181 A | * | 12/1991 | Foster et al. | 65/24 |
| 5,110,618 A | * | 5/1992 | Faust | 427/483 |
| 5,246,916 A | * | 9/1993 | Mooney et al. | 505/1 |
| 5,298,286 A | * | 3/1994 | Yang et al. | |
| 5,485,804 A | * | 1/1996 | Adair et al. | 117/90 |
| 5,534,309 A | * | 7/1996 | Liu | 427/458 |
| 5,709,577 A | * | 1/1998 | Jin et al. | |
| 5,912,210 A | * | 6/1999 | Krusin-Elbaum et al. | |

FOREIGN PATENT DOCUMENTS

JP        2-275396     * 11/1990

* cited by examiner

*Primary Examiner*—Fred J. Parker (57) ABSTRACT

Method and apparatus for seeding silicon substrates with diamond particles by electrostatic seeding. Method further includes either application of heat to form the particles into a layer, or chemical vapor deposition of diamond layer onto the particles. Disclosed products include silicon substrate having electrostatically affixed diamond particles, silicon substrate having particles at a density of at least $10^{12}$ particles per $cm^2$, and silicon substrate having polycrystalline layer having nucleation density of at least $10^{12}$ particles per $cm^2$.

5 Claims, 2 Drawing Sheets

PROCESS AND APPARATUS FOR APPLYING CHARGED PARTICLES TO A SUBSTRATE, PROCESS FOR FORMING A LAYER ON A SUBSTRATE, PRODUCTS MADE THEREFROM

BACKGROUND OF THE INVENTION

1. Field of the Invention

The present invention relates to a process and apparatus for applying particles to a substrate, to a process for forming a layer on a substrate, to substrates having particles, and to substrates having thin layers. In another aspect, the present invention relates to a process and apparatus for applying charged particles to a substrate, to a process for forming the charged particles into a layer, to substrates having charged particles, and to substrates having a thin layer. In even another aspect, the present invention relates to a process and apparatus for applying charged particles to a substrate at a density greater than $10^{11}$ paricles per $cm^2$, to a process of forming the particles into a layer, to a substrate coated with greater than $10^{11}$ charged particles per $cm^2$, to a substrate having a layer having a nucleation density greater than $10^{11}$ paricles per $cm^2$. In still another aspect, the present invention relates to a process and apparatus for applying charged diamond particles to a silicon substrate, to a process of forming the diamond particles into a layer on the silicon substrate, to silcon substrates having charged diamond particles, and to a silcon substrate having a thin diamond layer. In yet another aspect, the present invention relates to a process and apparatus for applying charged diamond particles to a silicon substrate at greater than $10^{11}$ particles per $cm^2$, to a process of forming the particles into a diamond layer on the silicon substrate, to silcon substrates having charged diamond particles at a density of greater than $10^{11}$ diamond particles per $cm^2$, and to a silcon substrate having a thin diamond layer with nucleation density greater than $10^{11}$ particles per $cm^2$.

2. Description of the Related Art

A. Diamond Film Nucleation

Due to a unique combination of its mechanical, physical, chemical, and electrical properties, diamond is an excellent material for a variety of applications. A wide range of applications which will utilize the exceptional mechanical, thermal, optical, and electronic properties of diamond are anticipated for thin diamond films. Examples include coating of mechanical tools and optical windows, protective layers on intergrated circuits, heat spreaders for high power electronic devices, microsensors, cold emitters, and high temperature semiconductor devices. The diamond films for these applications need to be prepared with specific desired microstructure, thickness, and reproducibility within the practical limits of time and expense.

The nucleation of diamond growth on a substrate depends on the substrate material on which the diamond is to be grown. The initiation of diamond growth is also affected by the surface conditions of the substrate. Unfortunately, formation of diamond films on non-diamond substrates has proved extremely difficult. It has long been understood that the low-nucleation density behavior of diamond is one of the key factors responsible for poor microstructure and morphology of films on non-diamond substrates. Lower nucleation densities require longer deposition times for continuous films and, consequently, result in large surface roughness due to large grain sizes, with problems being more pronounced for highly oriented films and low temperature growth.

From a technological point of view, silicon, as the basic material for present electronics, is strongly favored as a substrate material for thin film diamond devices. Consequently, diamond growth on silicon has received substantial attention in the prior art. However, owing to the high surface energy of diamond and the relatively low sticking probability of the precurser for diamond nucleation, diamond nuclei grow very poorly on a mirror-polished silicon substrate.

In general, the diamond films produced consist of polycrystalline, highly defective, randomly-oriented diamond crystals containing varying amounts of non-diamond carbon and hydrogen. Furthermore, a large number of microvoids (or microcavities) is present in CVD diamond films due to the large grain size of the crystallites (columnar growth) in combination with a low density of grains. The control of the microstructure of diamond films depends, to a great extent, on the nucleation density, and consequently, it requires control of the nucleation process. The deposition of diamond is enhanced by increasing the number of nucleation sites on the substrate, increasing the carbon content in the hydrogen plasma, or reinforcing the bonds between nuclei and the substrate. Failure to provide a high nucleation density results in polycrystalline diamond films with very rough surfaces and/or a porous core.

Diamond-nucleation density on a polished silicon surface is generally on the order of $10^4$ per $cm^2$. The ability to create an extremely high nucleation density for the growth of diamond films is a key problem for the realization of electrical and optical quality synthetic diamond.

Prior art methods exist to enhance diamond nucleation several orders of magnitude into the range of $10^7$ to $10^{11}$ per $^2$ cm. These prior art methods for enhancing diamond nucleation density on such a mirror-polished silicon substrate generally include (1) scratching or abrading the surface of the substrate; (2) creating submicrometer-craters by focused ion beams; (3) electrophoretic deposition of diamond monolayers (4) sputtering; (5) preferentially etching with a chemical solution to create micrometer-scale V-grooves; (6) coating with a low vapor pressure and high thermal stability hydrocarbon oil; (7) coating with a thin layer of evaporated carbon; (8) applying a substrate bias voltage; (9) spin-coating of photoresist containing seed particles, and (10) Si+ion beam implantation.

B. Machine Tools

The coating of machine tools (substrates) with diamond for enhanced cutting and operating life has been pursued for several years. The conventional approach to coating of substrates is by microwave chemical vapor deposition or hot filament chemical vapor deposition. Although these methods work to grow nearly pure diamond, they are expensive and/or slow. The initiation of chemical vapor diamond growth (i.e., nucleation) is affected by the surface conditions of the substrate. In general, diamond growth nucleates very poorly (i.e., slowly) on a substrate because of the high surface energy of diamond and the relatively low sticking probability of the precursor(s) for diamond nucleation.

C. References

Examples of prior art references dealing with diamond nucleation densities include the following.

U.S. Pat. No. 5,075,257, issued Dec. 24, 1991 to Hawk et al., discloses a method for the deposition of silicon and the formation of silicon films. Silicon powder of optimum particle size is aerosolized, charged, and then electrostatically deposited onto high melting point substrates, which may include semiconducting, insulating, and conducting materials such as silicon, sapphire, and molybdenum, respectively.

"Focused ion-beam crater arrays for induced nucleation of diamond film", A. R. Kirkpatrick et al., J. Vac. Sci. Technol. B 7 (6), November/December 1989, discloses the use of focused ion-beam (FIB) systems to ion-beam mill (sputter) shallow, small craters in precisely defined, reproducible patterns and spacings, and site densities of 1 per $\mu m^2$ or greater, with these craters causing nucleation.

"Early formation of chemical vapor deposition diamond films", S. Iijima et al., Appl. Phys. Lett. 57 (25) Dec. 17, 1990, discloses pretreatment of sonication of a silicon wafer in a water suspension of 10 micron-sized diamond powder, resulting in deposition of diamond powder in the range of $10^{10}$ to $10^{11}$ per $cm^2$ on the wafer.

"Surface And Interface Effects In The Nucleation And Growth Of Diamond", K.V. Ravi et al., New Diamond Science and Technology, 1991 MRS Int. Conf. Proc., discloses deposition of thin diamond like carbon (DLC) films on non-diamond surfaces is shown to substantially increase the nucleation density as well as facilitate the control of the microstructure of thick diamond films.

"Generation of diamond nuclei by electric field in plasma chemical vapor deposition", S. Yugo et al., Appl. Phys. Lett. 58 (10), Mar. 11, 1991, discloses a predeposition plasma chemical vapor deposition ("CVD") process of several minutes duration that is implemented prior to the normal CVD process. For the predeposition step, the methane fraction in the methane-hydrogen feed gas is increased and at the same time an electric field is applied to the substrate. Nucleation densities as high as $10^{10}/cm^2$ are obtained. After the predeposition process, diamond growth is carried out under normal CVD conditions.

"Nucleation of diamond on silicon, SiAlON, and graphite substrates coated with an a-C:H layer", J. J. Dubray et al., J. Vac. Sci. Technol. A, Vol. 9, No. 6, November/December 1991, discloses the deposition of an hydrogenated amorphous carbon layer on a substate surface to enhance nucleation of diamond.

"Catalyst effect for diamond nucleation in the low pressure process", K. Kobayashi et al., Materials & Manufacturing Processes, 7 (3) 395–403 (1992), discloses the use of a substrate coated with catalytic materials by vacuum deposition, in a hot-filament chemical vapor deposition process, to achieve nucleation densities an order of magnitude higher than untreated substrates.

"Thermodynamics and kinetics for nucleation of diamonds in the chemical vapor deposition process", N. M. Hwang et al., Diamond and Related Materials, 1(1992) 191–194, discloses that the nucleation intensity ratio of the stable to the metastable phase of diamond is shown to be critically affected by the variation of the specific surface energy ratio of the two phases.

"Nucleation mechanisms of diamond in plasma chemical vapor deposition", S. Yugo et al., Diamond and Related Materials, 2 (1992) 328–332, discloses the application of a negative bias to silicon, leading to the formation of diamond precursors, and a nucelation density as high as $10^{10}/cm^2$.

"Diamond film nucleation and interface characterization", P Bou et al., J. Mater. Res., Vol. 7, No. 8, August 1992, discloses an in situ pretreatment of a substrate in a plasma where large carbon carrier fluxes toward the surface are used, to minimize nucleation delay and enhance nucleation density.

"Nucleation and growth of diamond on carbon-implanted single crystal copper surfaces", T. P. Ong et al., J. Mater. Res., Vol 7, No. 9, September 1992, discloses prior to diamond nucleation, the modification of a single crystal copper surface by carbon implantation.

"Diamond crystallite formation on Si(100) from the gas phase: Seeding or heterogeneous nucleation?", E. Molinari et al., Appl. Phys. Lett. 61 (11), Sep. 14, 1992, studied depostion of diamond onto silicon wafers scratched with diamond paste to study nucleation enhancement.

"Investigation of surface preparation for diamond deposition on molybdenum substrates by secondary ion mass spectrometry", R. Steiner et al., Diamond and Related Materials, 2 (1993) 958–962, discloses a nucleation pretreatment of polishing of the surface of molybdenum substrates with SiC and diamond powder.

"Effect of substrate pretreatment on diamond deposition", Diamond and Related Materials, H. Maeda et al., 2 (1993) 758–761, discloses pretreatment of an Si wafer with diamond, c-BN, MoB, $LaB_6$, $TaB_2$ or Si powder suspended in acetone by an ultrasonic method.

"Electrophoretic Deposition of Diamond Monolayers for CVD Growth of Diamond Thin Films", J. L. Valdes, B. A. Tao, J. W. Mitchell, G. W. Kammlott, and L. Seibles, May 16–21, 1993, a method for nucleating the growth of chemical vapor deposition diamond films on silicon by electrophoretic deposition from either aqueous or non-aqueous dispersions containing sub-micron colloidal diamond particles to achieve nucleation densities on the order of $10^{10}/cm^2$.

"High Density Diamond Nucleation On Unseeded Substrates By A Combined Microwave And Radio-Frequency Plasma", May 16–21, 1993, discloses a microwave assisted chemical vapor deposition process in which nucleation was accomplished by applying an RF induced negative DC bias at a substrate that was immersed in a microwave plasma of a high methane concentration diluted by hydrogen.

"Nucleation And Growth Of Highly Transparent Nanocrystalline Diamond Films", W. Dotter, R. Erz, K. Jung and H. Ehrhardt, May 16–21, 1993, discloses nanocrystalline, optically transparent diamond membranes grown by microwave plasma deposition, with nucleation densities of $10^{10}$ nuclei/$cm^2$ obtained by scratching silicon and quartz substrates with 10 nm diamond powder, and nucleation densities exceeding $10^{11}$ nuclei/$cm^2$ with the dc-bias method.

"Evidence for nonclassical nucleation at solid surfaces in diamond deposition from the gas phase", M. Tomellini, J. Mater. Res., Vol. 8, No. 7, July 1993, discloses a two-step kinetic model which gives the non-steady-state nucleation density function in terms of the rate constants for the active site to germ, germ to active site, and germ to kinetic steps.

"Nucleation of oriented diamond films on nickel substrates", P. C. Yang et al., J. Mater. Res., Vol. 8, No. 8, August 1993, discloses a seeding and multistep deposition process to nucleate and grow diamond films directly on nickel substrates in a hot filament chemical vapor deposition system.

"Quantitative nucleation and growth studies of PACVD diamond film formation on (100) silicon", R. A. Bauer et al., J. Mater. Res., Vol. 8, No. 11, November 1993, discloses various surface treatments prior to microwave plasma assisted chemical vapor deposition of diamond films, including, diamond polishing, SiC scratching, alumina scratching, graphite powder wiping, and spin coating with polymethyl methacrylate.

"Diamond nucleation on pretreated substrates", K. Kobayashi et al., Diamond and Related Materials, 2 (1993) 278–284, discloses use of an iron thin film to enhance nucleation density.

"Initial stages in the growth of polycrystalline diamond on silicon", R. Stockel et al., Diamond and Related Materials, 2 (1993) 1467–1472, is a study of diamond films grown on crystalline silicon wafers scratched with a diamond suspension.

"Influence on diamond nucleation of the carbon concentration near the substrate surface", D. Michau et al., Diamond and Related Materials, 2 (1993) 19–23, discloses the most useful method to promote nucleation is to scratch the substrate with diamond paste.

"Epitaxial nucleation, growth and characterization of highly oriented, (100)-textured diamond films on silicon", B. A. Fox et al., Diamond and Related Materials, 3 (1994) 382, 387, discloses the use of bias enhanced nucleation in a multistep growth process for producing highly oriented, (100)-textured diamond films.

"Diamond nucleation on surfaces using carbon clusters", R. J. Meilunas et al., J. Mater. Res., Vol. 9, No. 1, January 1994 discloses the use of fullerene films sublimated onto various non-diamond substrates to produce nucleation sites suitable for the formation of continuous diamond film.

"Evaluation of a substrate pretreatment for hot filament CVD of diamond", J. Mater. Res., K. L. Menningen et al., Vol. 9, No. 4, April 1994, discloses measurement of the time evolution of both the methyl radical density and the acetylene mole fraction during hot filament chemical vapor deposition of diamond film.

"Selective growth of diamond using an iron catalyst", Y. Shimada et al., Diamond and Related Materials, 3 (1994) 403–407, discloses growth of diamond carried out on a silicon substrate with patterned iron films using chemical vapor deposition.

"Diamond nucleation on nickel substrates seeded with non-diamond carbon", Yang et al., J. Mater. Res., Vol. 9, No. 5, May 1994, discloses the use of graphite and $C_{60}$ powders to promote diamond nucleation. Prior to chemical vapor deposition, the nickel substrates were immersed into a suspension of either powders, and a layer of the carbon powder would be subsequently formed on the nickel surface when the substrates were removed from the suspension.

"Nanocrystal seeding: A low temperature route to polycrystalline Si films", J. R. Health et al., Appl. Phys. Lett., Vol. 64, No. 26, Jun. 27, 1994, discloses the use of eximer laser photolysis of disilane in a room temperature flow cell to produce silicon nanocrystals as seeds in making polycrystalline silicon films.

"Role of the nucleation step in the growth rate of diamond films", L. Fayette et al., Diamond and Related Materials, 3 (1994) 480–485, discloses, for the well-known microwave-plasma-enhanced chemical vapor deposition process, the influence of substrate temperature and of the methane concentration in the gas phase either on the diamond nucleation step or on the whole growth process.

"The effect of ballpoint ink coating on the nucleation enhancement of low-pressure diamond", Peng XiLing et al., J. Mater. Res., Vol. 9, No. 6, June 1994, discloses the coating of silicon with ballpoint pen ink to increase diamond nucleation density.

"Diamond nucleation by carbon fibers on unscratched substrate by hot-filament chemical vapor deposition", Nakamura et al., J. Mater. Res., Vol. 9, No. 7, July 1994, discloses the use of carbon fibers placed on unscratched substrates to nucleate diamond particles. The carbon fibers with approximate 7 $\mu$m diameter were fixed onto the silicon substrate by being held down with stainless steel plates at each end of the fibers prior to deposition.

"A pretreatment process for enhanced diamond nucleation on smooth silicon substrates coated with hard carbon films", Z. Feng et al., J. Mater. Res., Vol. 9, No. 8, August 1994, discloses pretreatment of unscratched silicon substrates with a methane-rich hydrogen plasma at a relatively low temperature for an hour to achieve diamond nucleation densities on the order of $10^8/cm^2$.

"Nucleation and growth during the chemical vapor deposition of diamond on $SiO_2$ substrates", J. Rankin et al., J. Mater. Res., Vol. 9, No. 8, August 1994, discloses scratching of silicon and fused silica substrates with diamond paste to enhance nucleation density.

"A modelling of diamond nucleation", S. Yugo et al., Diamond and Related Materials 4 (1995) 903–907 (presented Sep. 25–30, 1994, Diamond Films '94, Il Ciocco, Italy), discloses the use of negative bias on silicon substrate during microwave chemical vapor deposition of diamond.

"Nucleation and initial growth of diamond film on Si substrate", N. Jiang et al., J. Mater. Res. Vol 9, No. 10, October 1994, discloses scratching of polished silicon substrates with diamond paste to enhance nucleation density.

"Ultrahigh nucleation density for growth of smooth diamond films", G. S. Yang et al., Appl. Phys. Lett. 66 (3), Jan. 16, 1995, and "Effect of ultrahigh nucleation density on diamond growth at different growth rates and temperatures", G. S. Yang et al., J. Vac. Sci. Technol. B. Vol. 13, No. 3, May/June 1995, both disclose an extremely high nucleation density, calculated to be as high as $1.599 \times 10^{11}/cm^2$, was achieved by coating 0.038 $\mu$m diamond powder on the surface of the silicon substrate.

"Effect of the substrate state on the formation of diamond film in a low temperature microwave-plasma-enhanced chemical vapor deposition system", S. H. Kim et al., J. Vac. Sci. Technol. A, Vol. 13, No. 3, May/June 1995, discloses that low temperature deposition can be achieved only by making the substrate position remote from the plasma under the normal chemical vapor deposition conditions. Nucleation was enhanced by pretreatment of the substrate surface with 30 micron diamond powder-acetone solution in an ultrasonic cleaner.

"Enhancement of diamond nucleation by ultrasonic substrate abrasion with a mixture of metal and diamond particles", Y. Chakk et al., Appl. Phys. Lett. 66(21), May 22, 1995, discloses that the nucleation density obtained by ultrasonic abrasion with diamond powders alone can be enhanced by using a mixed slurry of diamond and metal powders. The metal powders utilized were W, Ta, Mo, Nb, Ti, Al, Fe, Ni, Cu and Si. Nucleation densities were on the order of $10^7$ to $10^9$ per $cm^2$.

"Mechanisms for the ion-assisted nucleation of diamond", S. McGinnis, May 1995 ECS Meeting 4th International Symposium on Diamond Materials, discloses the effects of substrate bias voltage, electrically isolated substrate regions, and substrate temperature on nucleation density rate, for an ion-assisted diamond nucleation process.

"$Si^+$ implantation: A pretreatment method for diamond nucleation on a Si wafer", J. Yang et al., Appl. Phys. Lett. 66(24), Jun. 12, 1995, discloses pretreatment of silicon wafer with $Si^+$ ion beam implantation for diamond nucleation.

"Evidence of an energetic ion bombardment mechanism for bias-enhanced nucleation of diamond", S. McGinnis et al., Appl. Phys. Lett., 66(23) June 1995, discloses a bias-enhanced nucleation of diamond to produce nucleation densities of $10^{10}/cm^2$.

"Diamond Nucleation And Growth On mirror-Polish Silicon Wafter Pretreated By Silicon Ion Implantation", Jie Yang et al., Applications of Diamond Films and Related Materials: Third International Conference, 1995, discloses diamond films obtained by the hot-filament chemical vapor deposition method on silicon wafer, with the substrates pre-implanted by a silicon ion beam.

"Seeding With Purified Ultrafine Diamond Particles For Diamond Synthesis By CVD", H. Makita et al., Applications of Diamond Films and Related Materials: Third International Conference, 1995, discloses seeding of silicon substrates with purified nanocrystal diamond particles about 5 nm in diameter by first removing the substrate surface oxidized layer with 10%. HF acid, and then dipping the substrates into a alcohol/water colloidal solution of the particles.

However, in spite of these advancements in the prior art, there is still room for improvement in providing diamond films on non-diamond substrates.

Thus, there is still a need for a substrate treating process that provides higher nucleation densities.

There is another need in the art for a substrate treating process that provides for a more uniform and reproducible distribution of the nucleation sites on the substrate.

There is even another need in the art for a treating process that can seed complex geometric shapes.

These and other needs in the art will become apparent to those of skill in the art upon review of this specification, including its drawings and claims.

SUMMARY OF THE INVENTION

It is an object of the present invention to provide for a substrate treating process that provides higher nucleation densities.

It is another object of the present invention to provide for a substate treating process that provides for a more uniform and reproducible distribution of the nucleation sites on the substrate.

It is even another object of the present invention to provide for a treating process that can seed complex geometric shapes.

These and other objects of the present invention will become apparent to those of skill in the art upon review of this specification, including its drawings and claims.

According to one embodiment of the present invention there is provided a method of seeding substrates for subsequent coating. The method utilizes electrostatic spraying to provide charged particles on a substrate. The method generally includes aerosolizing and electrostatically charging the seed particles with an electrostatic charge of one polarity. The substrate is then provided with a polarity suitable to attract the particles. The charged particles are then contacted with the substrate to form a seeded substrate having particles electrostatically affixed thereto. According to a further embodiment of this embodiment, the seeded substrate is then subjected to heat treatment to form the affixed particles into a layer. According to another further embodiment of this embodiment, deposition techniques are utilized to form a layer on the seeded particles.

According to another embodiment of the present invention there is provided a method of seeding substrates for subsequent coating. The method utilizes electrostatic spraying to provide charged particles on a substrate. The method generally includes dispersing the seed particles in a liquid to form a dispersed solution. The dispersed solution is then aerosolized and the seed particles electrostatically charged with an electrostatic charge of one polarity. The substrate is then provided with a polarity suitable to attract the particles. The charged particles are then contacted with the substrate to form a seeded substrate having particles electrostatically affixed thereto. According to a further embodiment of this embodiment, the seeded substrate is then subjected to heat treatment to form the affixed particles into a layer. According to another further embodiment of this embodiment, deposition techniques are utilized to form a layer on the seeded particles.

According to even another embodiment of this present invention, there is provided a seeded substrate having a particle density greater than about $5 \times 10^{11}$ particles per $cm^2$, which substrate is useful as a deposition precurser.

According to still another embodiment of this present invention, there is provided a seeded substrate having particles electrostatically affixed to the substrate, which substrate is useful as a deposition precurser.

According to yet another embodiment of the present invention, there is provided a substrate supporting a polycrystalline layer, with the polycrystalline layer having a nucleation density greater than about $5 \times 10^{11}$ per $cm^2$.

According to even still another embodiment of the present invention, there is provided an apparatus for seeding. The apparatus includes a reservoir of liquid and seeding particles, and a disperser for dispersing the seeding particles in the liquid. The apparatus further includes an electrostatic spray gun having a corona tip. A gas blower propels and provides the seeding particles to the corona tip. The apparatus even further includes a substrate holder for holding and positioning a target substrate at the discharge of the corona tip.

According to even yet another embodiment there is provided an apparatus for depositing a layer onto a substrate. The apparatus includes an electrostatic seeding sprayer to deposit a seed layer of charged particles from a reservoir of particles and liquid onto the substrate, and a deposition section for depositing a layer onto the seed layer. In a more specific embodiment, the apparatus further includes a disperser for dispersing the particles in the liquid.

DETAILED DESCRIPTION OF THE INVENTION

The process of the present invention utilizes electrostatic spraying for applying seed particles to a substrate. In general, electrostatic spraying is accomplished by contacting electrically charged particles with the target substrate which has been provided with an electrostatic potential suitable to attract the charged seed particles. Most conveniently, the substrate is grounded, an in the case of an insulator, is provided a conducting backing which is grounded.

Once the particles are contacted with the substrate, electrostatic attraction adheres the electrically charged particles to the substrate. The resulting particle coated substate is then useful as a precurser to form either a coated substrate by application of heat to fuse the particles together and cure it into a layer, or by subsequent deposition of a crystalline layer onto the particles which function as nucleation or seed sites.

Figure 1:
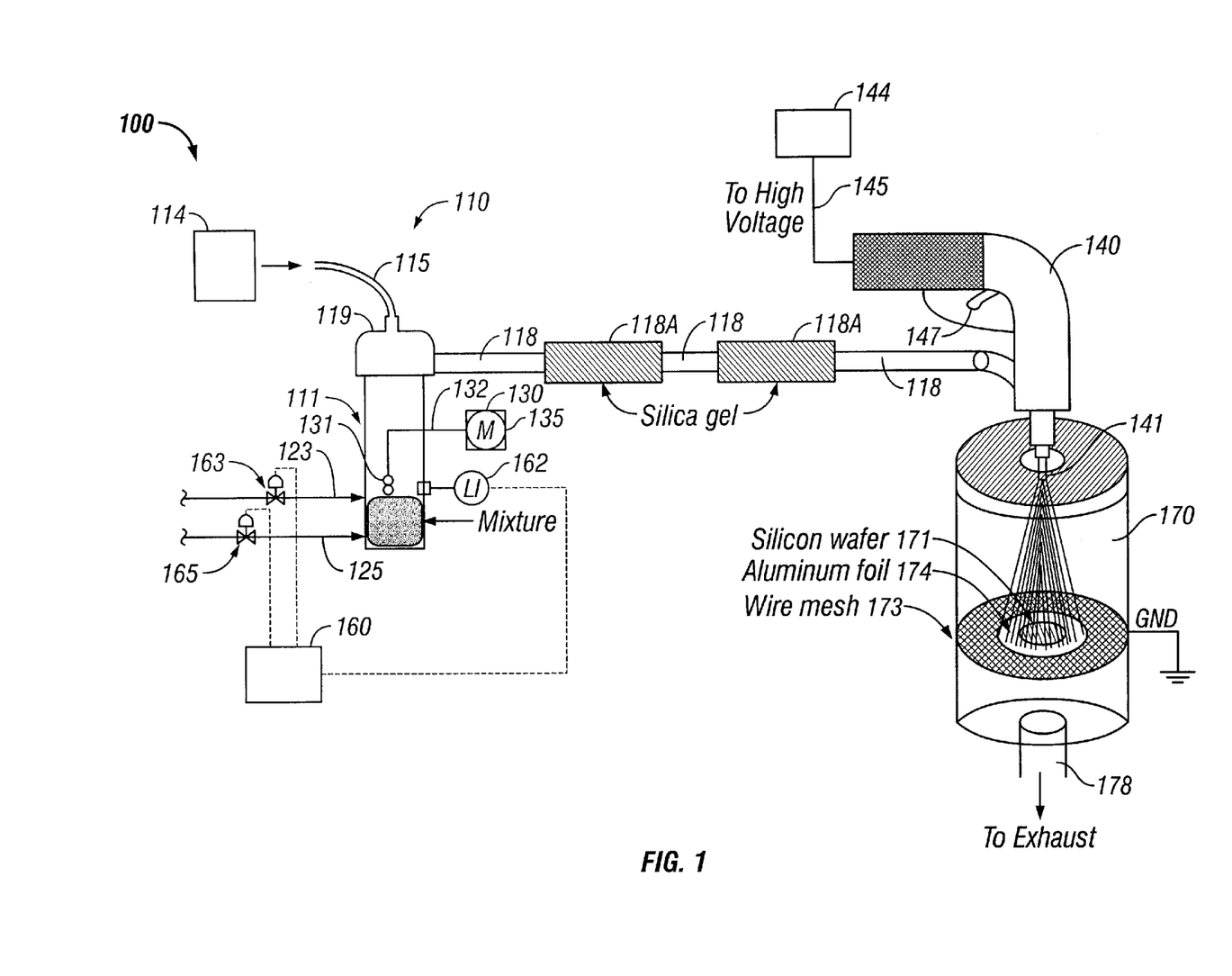
FIG. 1 is a schematic representation of the electrostatic seeding apparatus 100 of the present invention, which includes powder feeder 110, electrostatic spray gun 140, and seeding chamber 170.

Referring now to FIG. 1, there is shown a schematic representation of one embodiment of the electrostatic seeding apparatus 100 of the present invention. As shown in FIG. 1, electronic seeding apparatus 100 includes particle feeder 110, electrostatic spray gun 140, and seeding chamber 170.

Particle feeder 110, includes reservoir 111 of a dispersion of seed particles in liquid, gas supply 114 for providing gas through line 115 for diffusing the liquid carrier and particles through tubing 118 toward corona tip 141 of electrostatic spray gun 140.

In the practice of the present invention, any electrostatic spray gun, suitable to charge the seed particles may be utilized. A suitable commercially available example includes the Nordson Corporation "Econo-CoAT® Series II Powder Coating System". In the embodiment shown in FIG. 1, electrostatic spray gun 140 includes voltage source 144 connected to gun 140 via line 145, trigger switch 147 and corona tip 141. The present invention is not dependent upon any particular voltage utilized, but rather, particles must be adequately charged to electrostatically adhere to the target substrate. In the embodiment as shown in FIG. 1, the electrostatic spray gun voltage utilized is about 80KV.

Reservoir 111 contains the seeding particles and a carrier liquid. Reservoir 111 is generally charged by removing nebulizer 119 and adding desired amounts of liquid and particles. Optionally, reservoir 111 may be equipped with particle line 123 and liquid line 125, which may be used to charge reservoir 111 on a batch or continuous fashion. Automatic control may optionally be provided by any number of methods and means to control input of particles and liquid to reservoir 111, For example, a simple control system would utilize controller 160, which receives input from level indicator 162 and controls powder flow valve 163 and liquid flow valve 165.

Nebulizer 119 is suitable to receive gas from gas supply 114 and aerosolize the particles. Tubing 118 connects reservoir 111 to corona tip 141. Gas supply 114 provides a flow of gas that directs aerosolized particles from reservoir 111 through tubing 118 to corona tip 141. In the embodiment shown in FIG. 1, gas supply 114 provides 30 psi air to nebulizer 119.

A dispersing system is provided to disperse seed particles in the carrier liquid. Non-limiting examples of suitable dispersing systems include shaft or gear driven propellers, magnetic stirrer systems, mixers, sparging systems and liquid circulation systems. In the embodiment as shown in FIG. 1, disperser 130 includes motor 135 applying rotation to drive shaft 132 and propeller 131.

One or more desiccators 118A are provided along tubing 118 to remove moisture from the aerosolized particles. This present invention is not dependent upon any certain type of desiccant utilized, provided that sufficient moisture is removed from the aerosolized particles so that they may be electrostatically charged and will subsequently electrostatically adhere to the substrate. Non-limiting examples of suitable desiccants include activated alumina, calcium chloride, silica gel or zinc chloride.

Seeding chamber 170 is suitably sized to hold target substrate 171. A substrate support is provided to position substrate 171 at the discharge of corona tip 141. The substrate support is generally movable relative to the corona tip 141 to provide variation in distance between the target support 171 and corona tip 141. As shown in FIG. 1, the substrate support includes wire mesh 173 and optionally further includes a foil holder 174.

Seeding chamber 170 is further provided with an exhaust 178 for the recovery of exhaust gas which may be filtered to recover particles for recycle to reservoir 111. For seeding complex shapes, it is possible to utilize substrate holders which will manipulate, for example rotate or turn, the orientation of the substrate during seeding. In addition, multiple seeding spray nozzles may be utilized.

Non-limiting examples of seed particle materials which may be utilized in the present invention include diamond, cubic Boron nitride, tungsten carbide, silicon carbide, aluminum oxide, silicon nitride, and combinations thereof. Diamond is the most preferred seed particle material.

The seed particles of the present invention may be utilized with binders, non-limiting examples of which include TiN, TiC,TiCN, $Al_2O_3$, $ZrO_2$, NisAl, $AlB_{12}$, $Ti_2B$, silicon, tantalum, tungsten, and mixtures thereof.

The seed particles of the present invention may also be utilized with particles which will assist in catalyzing deposition. Suitable catalyst particles are disclosed in Appl. Phys. Lett. 66 (21), May 22, 1995, Chakk et al., herein incorporated by reference, and include W, Ta, Mo, Nb, Ti, Al, Fe, Ni, Cu, and Si.

The seed particles utilized may be of any regular or irregular geometric shape, including powders, spheres, fibers, and combinations thereof. Preferably powder or spherical particles are utilized.

The size of the seed particles is generally selected to provide the desired nucleation density, with it generally noted that the maximum theoretical nucleation density is inversely proportional to seed particle size. Thus, the particle size is generally selected to provide the desired nucleation density. For example, nucleation density of about $10^{10}$ per $cm^2$ will be obtained using particles of about 100 nm in diameter, nucleation density of about $10^{11}$ per $cm^2$ will be obtained using particles of about 31.6 nm, and nucleation density of about $10^{12}$ per $cm^2$ will be obtained using particles of about 10 nm. Particle density may also be controlled during the electrostatic spraying process, by providing a denser or sparser application of particles as desired.

The liquid utilized in reservoir 111 is a carrier which allows separation of the seed particles, and which has a sufficiently high volatility to substantially evaporate prior to arriving at the seed chamber 170. Condensation of the liquid should not occur in seed chamber 170. Generally, non-limiting examples of suitable liquids include volatile organic compounds, water, metallo-organic compounds. Preferably, liquids utilized in the present invention include water, deionized water, distilled water, methanol, ethanol, isopropyl alcohol and acetone.

The ratio of seed particles to carrier liquid should generally be low enough to avoid clumping of the seed particles, and high enough to provide a suitable rate of particle application. Generally, the ratio of seed particles to carrier liquid will be at least 0.1 grams particles per 100 ml liquid. Preferably, the ratio of seed particles to carrier liquid will be in the range about 0.1 grams particles per 100 ml liquid to about 2 grams particles per 100 ml liquid.

Surfactants may optionally be utilized in the present invention. The surfactants are generally wetting agents or detergents which effect the interfacial tension between the liquid and particles to assist in dispersing the particles in the liquid and to reduce the incidence of particle clumping. A non-limiting example of suitable commerically available surfactant includes Triton X-100,and Palmolive dish washing detergent. Surfactants utilized will generally comprise less than about 10.0 weight percent, based on the weight of the liquid, more preferably less than about 5 weight percent, and most preferably less than about 2 weight percent.

The present invention may be utilized to provide seed particles on substrates of different materials and shapes. The present invention finds utility in providing seed particles on simple to complex geometric shapes. Non-limiting examples of suitaable substrate materials include, insulators, semiconductors, superconductors, and conductors.

The substrates utilized in the present invention must be suitable to withstand the temperatures of the deposition process. Non-limiting examples of materials suitable for use as substrates in the present invention include silica, silicon, alumina, molybdenum, steel, silicon carbide, tungsten carbide, tungsten, silicon nitride, nickel, yttrium-barium copper oxide superconductors, thallium-based superconductors, and combinations thereof. Preferably, the substrate is silicon.

The present invention may be utilized to make any product requiring a deposited layer thereon. Non-limiting examples of specific items which may be utilized in the present invention include wafers for electronic applications, cutting tools, ceramic tools, chip breaker inserts, rotary tools such as drills or endmills, abrasive grinding surfaces and the like.

In applying the seed particles to the substrate, a stencil or shawdow mask may be utilized to create a desired pattern of seed particles on the substrate. It is noted that particles which do not adhere to the target substrate may be reclaimed and recycled.

Once seed particles have been applied to the substrate, heat may optionally be applied to form the particles into a layer. Generally, it is necessary that sufficient conditions, i.e. suitable temperature and/or pressure, be provided to fuse a part of or all of the particles, thereby forming a layer upon cooling. Non-limiting examples of suitable heating methods include conventional sintering, infrared heating, microwave sintering, laser surface alloying and induction heating.

Alternatively, once seed particles have been applied to the substrate, a polycrystalline layer may be grown on the seed layers.

The polycrystalline layer will generally comprise any material that may be suitably deposited on the seed particles. Generally, the polycrystalline layer will comprise diamond, cubic Boron nitride, tungsten carbide, silicon carbide, aluminum oxide, silicon nitride, and combinations thereof. Most preferably the polycrytalline layer comprises diamond.

While any suitable method may be utilized for growing the polycrystalline layer, the most common method is chemical vapor deposition. Non-limiting examples of electro-chemical vapor deposition techniques include use of hot filament, microwave, oxy-acetylene torch and DC arc jet.

In the operation of the microwave chemical vapor deposition process of the present invention, it must be appreciated that the deposition of the seed particles is a function of the distance between the corona tip and the target substrate, the length of the spray time, the velocity of the seed particle flow, and the electrostatic charge level. Any one of these parameters will vary widely depending on the desired end result and the value of the other parameters.

The present invention may be utilized to make substrates useful in thermal management in microelectronics (e.g., multi-chip module substrates), microelectronics (e.g., active p-n junction devices), tribology (e.g., coatings for aerospace applications), optics (e.g. coatings for lenses for high power lasers), bio-medical (e.g., coatings for artificial joints and surgical instruments), x-ray photolighography masks (e.g., submicron level photolithography for integrated circuit fabrication), and tool coating.

EXAMPLES

The following examples are provided merely to illustrate the present invention, and are not intended to limit the scope of the claims of the invention.

The following examples illustrate a deposition method used to deposit diamond films, and various seeding techniques used to nucleate diamond growth.

Deposition of diamond films generally involves seeding of a bare silicon substrate and growth of diamond film in a microwave plasma environment.

Diamond Film Deposition Equiment and Procedure

Once the silicon substrate is pretreated to enhance nucleation density, a diamond film layer is deposited onto the substrate. Pretreatments include mechanical abrading in Example 1, Photoresist seeding in Example 2, and the electrostatic seeding invention of the present invention in Example 3.

For the following Examples 1–3, diamond film deposition was accomplished using microwave plasma-enhanced chemical vapor deposition (PECVD).

Diamond films were deposited on 3.0 inch diameter (100) p-type silicon substrates using microwave plasma-enhanced chemical vapor deposition (MPCVD) in a DMS-100 Wavemat microwave PECVD reactor with a MPDR 313HP microwave cavity operating at 2.45 GHz. The cavity has been designed to operate at TM 012 mode so that a uniform plasma disc is generated over a 3.0 inch diameter substrate.

Microwave power supply: A SAIREM model GMP 60 KE 2 microwave power generator operating at 2.45 GHz with a YJ 1600 magnetron and a maximum power rating of 6000 watts is used. The generator is triode regulated which allows operation at a very low ripple rate (<1%) and is highly suitable for monomode applications. The microwave head (model G 111) consists of a magnetron mounted on a magnetron guide transition equipped with a system for arc detection, an IGS 200 isolator that protects the magnetron against reflected power, a system to measure reflected power, a filament transformer, a fan for cathode cooling, and a water cooling circuit. The connection to the power supply block is made with a high voltage connector and the microwave connection output is a standard flange UG 553. The power generator is controlled remotely from a standard 19" rack integrated into a cabinet. The power supply and the magnetron are protected against excessive transformer temperature, reflection by the isolator, overcurrent of the magnetron, wrong connection of connectors, arcing in the guide, lack of cooling water, a high voltage short circuit, a faulty power supply filament or magnetron/triode/electromagnet, and excessive magnetron and triode temperature.

Optical pyrometer: A MIKRON model M67S infraducer infrared thermometer is used to measure the substrate temperature. The infraducer is a device approximately 8" long used to measure the temperature of remote objects without physical contact. Hot objects emit infrared radiation which is captured by the instrument. The thermal radiation intensity received is directly related to the object temperature. The infraducer converts the radiation to an electrical signal which is linearly proportional to the temperature of the object. The signal is sent to the PLC for read out and control. To ensure minimal interference from any objects other than the target, an optical focussing system is used. This helps to concentrate the energy from a spot located on the surface of the target onto the detector in the instrument. The pyrometer is calibrated for spectral response in the wavelength range from 0.9 $\mu$m to 1.8 $\mu$m with a 4–20 mA linear output. The field of view is set for 14" to infinity to either partially or completely eliminate the influence of background radiation,.

Oxygen sensor: A BACHARACH model OX130 oxygen detection transmitter is used to detect the oxygen percentage in the reactor chamber. The transmitter unit consists of an oxygen sensor (electrochemical cell) and a transmitter circuit board. The oxygen sensor develops an output signal proportional to the detected concentration of oxygen, which is then fed to the circuit board. A current signal between 4 and 20 mA is then generated and sent to the PLC.

Water flow sensor and controller: Proteus model 600 series flow sensors are installed in the flow line to measure the flow rate of water. The flow passing through the sensor spins a magnetic rotor which induces a voltage in a pick-up coil. The rotor is also visible through a clear face plate to give a visual indication of flow. Electrical impulses from the sensor are read by a Proteus 2000 series flow meter. The Proteus programmable flow meter can measure the flow rate and total flow of water for up to eight channels. The pulses from the sensors are counted by the meter electronics and the meter's microprocessor converts them into flow rates or flow totals. These are displayed by a 16 character LCD display on the front panel. An analog output is available which is used for an additional alarm through the PLC. The meter has a programmable trip point for each of its eight channels and relays. Programming of the meter can be performed from the front panel.

Pressure gauges: MKS Baratron Type 122B absolute pressure gauges are used for accurate chamber pressure measurement. Three baratron gauges are used to measure the pressure in different ranges: i) 0–1000 Torr, ii) 0–200 Torr, and iii) 0–200 mTorr. A MKS Type 124 absolute pressure transducer provides two independent, fully adjustable set point relays, in conjunction with the Type 122 Baratron. The relay electronics contain circuitry which compares the pressure signal to two independent adjustable set points, two SPDT relays for controlling valves, alarms, sequences, etc., and two LED indicators.

Throttle valve: A MKS Type 152E exhaust valve controller controls a stepper-motor powered exhaust valve (Model 253) to maintain a constant pressure in the vacuum system by varying the pumping speed. An external analog signal is used to command the set point. Digital signals can open, close, stop, and soft-start the valve.

Mass flow meters: Sierra Instruments model 820 electronic mass flow meters are installed in all gas lines to monitor gas flow. MKS mass flow controllers model 1100 series are used to accurately measure and control the mass flow rate of gases. The mass flow controller is controlled remotely from the PLC.

Figure 2:
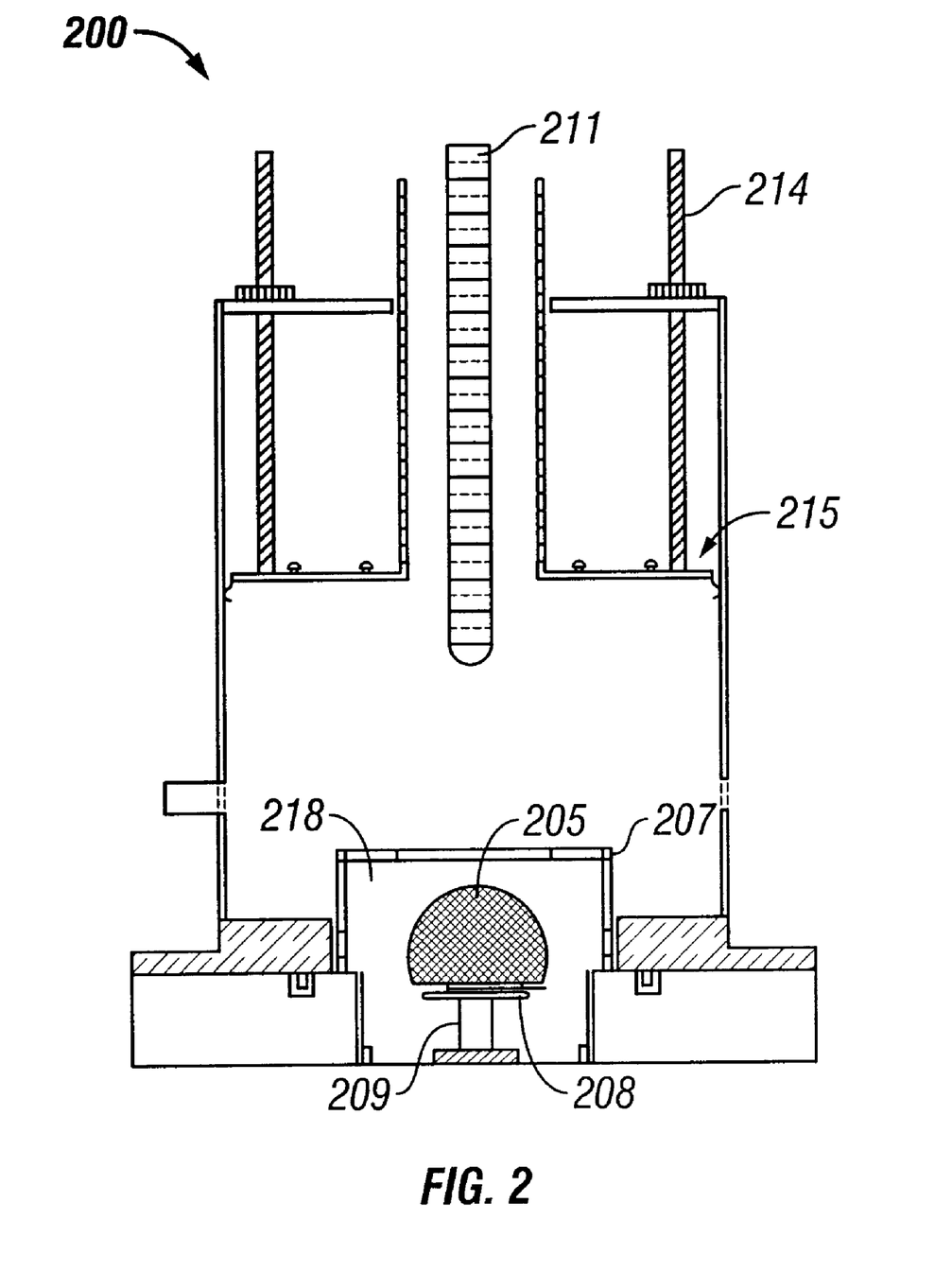
FIG. 2 is a schematic of microwave cavity 200 utilized for chemical vapor deposition.

A substrate lowering/raising mechanism is used to load the substrate. The gases are confined in a quartz belljar of base diameter 5.0 inches and a height of 3.58 inches. The cavity, designed to operate in a single mode TM012, has a diameter of 7.0 inches. A schematic of the microwave cavity 200 is shown in FIG. 2, including microwave probe 211, short 214, height adjustments 215, substrate holder 208, cooling water 209 inside holder 208, belljar 205, surrounded with cooling nitrogen 218 and water jacketed wall 207.

The operation of the Wavemat microwave plasma reactor involves a SYS-ON sequence, where the readiness of the reactor is verified, and involves an actual deposition sequence, where the required deposition conditions are set and alarms to indicate any deviation are activated.

SYS-ON sequence: The Honeywell programmable logic controller (PLC) controls the start-up sequence and the shut-down procedures of the reactor.

The SYS-ON sequence consists of the following steps:
i) evacuate the chamber to below 4 mTorr and continue pumping down for 3 minutes,
ii) turn on cooling water, belljar cooling nitrogen, and microwave power supply, and
iii) vacuum leak check for 3 minutes after closing the roughing valve.

Deposition sequence: The following sequence of operations were followed to start a deposition run:

i) introduce argon and hydrogen into the chamber,
ii) set the required chamber pressure,
iii) set the microwave power to 800 watts and strike the plasma when the throttle valve is completely closed,
iv) cut-off argon and increase hydrogen flow to the required value,
v) increase the power as the pressure builds up,
vi) after 2 minutes of exposure to the hydrogen plasma, introduce methane at the required flow rate, and
vii) set the power and pressure to achieve the required substrate temperature.

The diamond deposition parameters are shown in the following Table 1.

TABLE 1

| Diamond deposition parameters | |
|---|---|
| Substrate | (100) Silicon |
| Gases | Methane, Hydrogen |
| MW Power | 1600 watts |
| Reactor Pressure | 40 Torr |
| Substrate Temperature | 850° C. |

Majority of the example runs were performed without a water cooled substrate stage under the above deposition conditions. A cooled stage for the substrate was added to the reactor in the latter part of this example which could control the substrate temperature independent of the microwave power and reactor pressure. The cooled stage facilitates the operation of the reactor up to a reactor pressure of 100 Torr and a microwave power of 4 kw.

Example 1

Mechanical Abrading Seeding

This example relates to mechanical abrading of the silicon substrate with fine size particles of diamond, which is one of the most popular of the prior art techniques to enhance nucleation density.

Several experiments were performed using 0.1 $\mu$m size diamond particles in a slurry and hand polishing the silicon substrate surface. Diamond was deposited for 20 hours at 1600 watts of absorbed power, 40 Torr reactor pressure, and 1% methane concentration, at different locations on the substrate. The nucleation density achieved depends on how long the substrate is polished and the polishing pattern followed. Hand polishing results in a non-uniform pattern of scratches because the force applied during the scratching process is non-uniform. This results in a diamond film that is discontinuous over a 3 inch substrate, but continuous in places where there is a high scratch density. A continuous film exhibited a crystalline morphology with random orientation. This indicates that a high scratch density is necessary to deposit a continuous diamond film with good uniformity and surface morphology. However, obtaining a high scratch density everywhere on a large area substrate is difficult with this method. Basically, hand polishing is not a sufficiently reproducible technique and is not recommended for nucleating large area diamond growth.

Machine polishing was also explored using 0.1 $\mu$m diamond grit on a Buehler polishing apparatus. The polishing was performed for 40 seconds with a 15 lb force applied and the abrasion reproducibility was much better. A diamond film deposited for 20 hours under the same conditions as noted above. The surface morphology is more uniform over the 3 inch substrate. However, a few discontinuities in the film were observed near the edge of the substrate resulting from low nucleation density. Abrading the substrate surface using a machine is a feasible approach to diamond growth nucleation when optimized to produce a uniform scratch density. But, it is not a suitable technique for commercial applications because, for electronic applications, scratching damages the substrate surface and can induce defects.

Deposition

A diamond layer was deposited upon an unpolished (control) substrate and a substrate subjected to mechanical abrading pretreatment, by PECVD as explained above.

Specifically, the backside (unpolished, as cut) of a clean, bare, silicon substrate was used as a substrate for diamond deposition. A methane-hydrogen plasma at 1600 watts absorbed power, 40 Torr reactor pressure, and 1% methane concentration were the process conditions for a deposition time of 20 hours. The substrate, after deposition, was examined using SEM to determine if there was any diamond growth. A few isolated diamond particles had begun to grow in some of the crevices and on the uneven surface. There was no apparent weight gain after 20 hours of deposition. The backside of another wafer was hand polished for 5 minutes using 0.1 $\mu$m diamond particles and cleaned ultrasonically before introduction into the reactor. A diamond deposition was carried out for 20 hours under identical conditions as in the previous case. A weight gain of 45 mg was obtained. SEM reveals the surface morphology of the diamond film is continuous and uniform with a high average surface roughness. It appears that the surface roughness of the substrate was almost directly transferred to the film surface.

Example 2

Photoresist Seeding

Seeding

Silicon substrates were seeded using a standard recipe in which fine diamond particles are mixed ultrasonically in photoresist. Generally, the steps involved in the process are:

i) add 140 mg of Amplex 0–0.25 $\mu$m diamond powder (average size of 0.1 $\mu$m, available from Amplex Corporation, Bloomfield, Conn.) with 15 ml of Shipley type A photoresist thinner (available from Shipley Company, Marlboro, Mass.), ii) ultrasonically agitate the above mixture for 15 minutes or until the powder is well mixed.

iii) add 40 ml of Shipley 1470 photoresist to the above mixture, iv) ultrasonically agitate the mixture for 15 minutes or until it is well mixed, v) pour a sufficient amount of the mixture onto the surface of a wafer, mounted on a wafer spinner, to cover the entire surface, vi) ramp up the spin speed in 10 seconds to 4000 rpm, continue spinning at 4000 rpm for 30 seconds, and ramp down to 500 rpm in 5 seconds before a complete stop, and vii) bake the seeded silicon wafer at 135° C. for 30 minutes.

A systematic study of photoresist seeding using diamond particles of sizes 0.004 $\mu$m, 0.1 $\mu$m, 5 $\mu$m, and 10 $\mu$m was performed. Silicon substrates were cleaned using a virgin wafer cleaning procedure, as disclosed in "Integrated Circuit Fabrication Laboratory Manual", W. D. Brown et al., University of Arkansas, 1995, herein incorporated by reference, and then spin-coated with a diamond particle-photoresist mixture, as described above, at a spin speed of 4000 rpm. The seeded substrates were exposed to a hydrogen plasma for 10 minutes to burn-off the photoresist so that the individual seeds (diamond particles) could be identified. Using an SEM micrograph and by carefully counting the number of particles over an area of 100 $\mu$m$^2$, a nucleation density of approximately 10$^4$ cm$^{-2}$ was determined for the substrate seed with 10 $\mu$m size diamond particles. Likewise, a nucleation density of approximately 10$^5$ cm$^{-2}$ was determined for the substrate seed with 5 $\mu$m size diamond particles, and a nucleation density of >10$^8$ cm$^{-2}$ for the substrate seed with 0.1 $\mu$m size diamond particles. However, clustering of particles with cluster sizes >1 $\mu$m was observed. For the silicon substrate seeded with 4 nm size diamond particles distributed uniformly, a few clusters of size a few tenths of a micron, along with very tiny particles, were observed.

Deposition

Diamond was deposited on substrates seeded with 10 $\mu$m, 5 $\mu$m, 0.1 $\mu$m and 0.004 $\mu$m size diamond particles. The deposition conditions were 1600 watts, 40 Torr, and a methane flow of 3 sccm in 300 sccm of hydrogen for 20 hours. For diamond films deposited on substrates seeded with 10 $\mu$m and 5 $\mu$m size diamond particles, respectively, individual seed particles grew bigger, but there was no continuous film formation. A weight gain of 14 mg was obtained for the case of 10 $\mu$m seeds and a weight gain of 10 mg was obtained for the case of 5 $\mu$m seeds. A continuous diamond film was deposited on the entire 3 inch silicon substrate seeded with 0.1 $\mu$m diamond particles. The film exhibited a polycrytalline surface morphology with randomly-oriented facets. A weight gain of 68 mg was achieved in 20 hours. A Digital Instruments Nanoscope III Scanning Probe microscope in the contact AFM mode revealed an average surface roughness of 150 nm over a 10 $\mu$m$^2$ area. The cross-section of the diamond film was examined by fracturing the wafer at the center and observing the fractured surface under the SEM. The 5 $\mu$m thick film appeared dense and columnar growth of the seed crystals was clearly observed. A continuous diamond film with good uniformity was obtained on a substrate seeded with 0.004 $\mu$m size diamond particles with a weight gain of 78 mg. The surface morphology exhibited individual crystals with small crystals growing from the grain boundaries.

The different weight gains for the 10 $\mu$m particles, 5 $\mu$m particles, 0.1 $\mu$m particles and 0.004 $\mu$m particles were about 15 mg, 10 mg, 70 mg and 78 mg, respectively. It appears that the smaller particle sizes resulted in a higher nucleation density, and hence, a higher weight gain. However, the weight gain for the 10 $\mu$m size particle seeding with a nucleation density of 10$^4$ cm$^{-2}$ is slightly higher than the weight gain obtained for 5 $\mu$m size particle seeding with a nucleation density of 10$^5$ cm$^{-2}$. Sub-micron particles were present as the size distribution of the particles used for seeding is not very tight. These sub-micron particles, which were not counted when calculating the nucleation density, probably account for the slightly higher weight gain for the samples seeded with 10 $\mu$m size particles. In other words, the actual nucleation density may be substantially higher than 10$^4$ Cm$^{-2}$. In any case, a general trend is that the smaller the particle size, the higher the nucleation density, and hence, the higher the weight gain.

Optimized photoresist seeding with 0.1 $\mu$m size diamond particles was used. Diamond growing upward into columns from individual seeds and parallel to the substrate surface to form large contact areas was observed. These contact areas on the substrate promote good adhesion. A few micro-voids were observed between the bases of the columns. The size of the voids varies from sub-micron to 1 micron in size. A cross-sectional SEM of a diamond film showed these micro-voids located between the columnar growth of diamond seeds. As the film grows to about a micron thick, the voids originating from the distantly spaced seeds usually disappear resulting in a continuous diamond film. The number of micro-voids is a function of the nucleation density, and the size and shape of the particles. Also, the closer the seeds are spaced, the smaller and fewer in number are the micro-voids. The size and number of micro-voids was small when the photoresist seeding technique using 0.1 μm particles was used, compared to results reported in the literature.

Example 3

Electrostatic Seeding

Silicon substrates were also seeded with fine diamond particles using an electrostatic seeding technique. Different mixtures of diamond powder and water were prepared in this example. Generally, the steps involved in this seeding technique are as follows:

i) add 10 gm of Amplex 0–0.25 μm diamond powder (average size of 0.1 μm) with a few drops of surfactant, ii) slowly add 100 ml of water to the mixture by doubling the amount of water each time (start with adding 5 ml of water, then add 10 ml, then make it 20 ml etc.), iii) ultrasonically agitate the mixture for 15 minutes or until it is completely mixed, iv) use a magnetic stirrer to completely mix the powder with water, v) pour the mixture into a jet nebulizer and continue mixing using a magnetic stirrer, vi) the output of the nebulizer should be allowed to flow through a silica gel dryer before reaching the electrostatic spray gun, vii) connect the air to the nebulizer at a line pressure of 30 psi, viii) adjust the distance between the substrate and the tip of the gun to 6 inches, ix) adjust the voltage on the gun to 80 kV, and x) continue spraying by pressing the trigger for the required amount of time.

A schematic of the electrostatic seeding set up as shown in FIG. 1, described previously. Briefly, electrostatic seeding apparatus 100 includes powder feeder 110, electrostatic spray gun 140, and seeding chamber 170.

Diamond particles of 5 μm size were used to seed silicon wafers using the above described electrostatic seeding technique. Dry powder was loaded into a jet nebulizer and sprayed using an electrostatic powder spray gun as described above. Before attempting diamond growth, a seeded sample was exposed to a hydrogen plasma to test the stability of the electrostatically-seeded particles on the substrate surface. A chamber pressure of 40 Torr, an absorbed microwave power of 1600 watts, and a hydrogen flow of 300 scam was used during the 10 minute test. The wafer was weighed before and after exposure to the hydrogen plasma and no difference in weight was found indicating that the particles are stable even in the turbulence present in the reactor. Using an SEM micrograph of a seeded wafer, the nucleation density of $10^6$ cm$^2$ was determined by counting the number of diamond seeds in a 100 μm$^2$ area. The maximum possible nucleation density, calculated by assuming the diamond particles to be spheres of 5 μm diameter evenly distributed over the entire surface area (one particle deep), is 4×$10^6$ Cm$^{-2}$. The spreading of the particles was observed to be limited by clustering or overlapping of the particles on the substrate surface.

Diamond was then deposited on the wafer electrostatically-seeded with 5 μm size diamond particles. A 10 hour deposition was performed at 1600 watts, 40 Torr, and a CH$_4$ flow of 3 sccm in a H$_2$ flow of 300 sccm. The weight gain due to diamond growth was 21.3 mg. Individual seeds grew larger. The distribution of the particles was not uniform over the entire silicon surface and the particle separation was too great to allow sufficient diamond growth in 10 hours to bridge the distance between particles.

A large difference in weight gain can be observed when these results are compared to those obtained using photoresist seeding with 5 μm size diamond particles. A 40 hour deposition was also performed on an identical electrostatically-seeded substrate. The deposition conditions were the same as those used in the 10 hour deposition, and produced a continuous diamond film with diamond crystal facets at the center of the substrate. A weight gain of 100 mg was obtained. The seeds grow into ball-shaped particles until they coalesce to form a continuous film. If the deposition were continued for a longer time, the growth would proceed perpendicular to the substrate surface and individual facets would be established like those seen at the center of the substrate.

Electrostatic seeding was performed using 0.1 μm and 4 nm diamond particles. In order to disperse the particles well, they were mixed in water with a few drops of surfactant as described in Example 1. All the spray experiments were performed at a voltage of 80 kV and a pressure of 30 psi. A magnetic stirrer was used to mix the solution during the spray process. A substrate was seeded using a 5% solution of 4 nm size diamond particles sprayed for 1 minute. The substrate surface was almost completely covered and contained a few clusters distributed spatially on the surface. These clusters are believed to result from a high concentration of particles in the spray mixture. The diamond film was deposited on this substrate at 2700 watts of absorbed power, 62 Torr, and 3 sccm of methane in 300 sccm of hydrogen for 10 hours. A weight gain of 37.3 mg was obtained. The surface exhibited a rough morphology resulting from the unevenly seeded surface. A magnified image revealed crystalline diamond facets with random orientation.

A wafer was electrostatically seeded using 5% solution of 4 nm diamond particles sprayed for 5 minutes. Higher surface coverage was obtained as compared to spraying for 1 minute. There also appears to be a larger number of clusters. A diamond film deposited on this seeded substrate resulted in a weight gain of 68.7 mg in 10 hours at 2700 watts and 62 Torr. This is almost double the weight gain that was obtained in the previous case where seeding was done by spraying for 1 minute. The surface morphology of this film appears essentially the same as that obtained from the 1 minute sprayed seed substrate. Thus, it appears that a higher seed density decreases the incubation period for diamond growth and substantially increases the growth yield.

Next, a substrate was electrostatically-seeded with 5% solution of 0.1 μm size diamond particles by spraying for 2.5 minutes. Diamond film was deposited on this seeded substrate for 10 hours at 2700 watts, 62 Torr, and 3 sccm of methane in 300 sccm of hydrogen. A weight gain of 66.5 mg was obtained. A similar weight gain was obtained for a substrate seeded by spraying for 1 minute. The surface morphology is similar in both cases and comparable to that obtained for 4 nm seeded substrates. It appears that about 66 mg is the maximum possible weight gain for the ultimate seeding density and for the deposition conditions mentioned above. By properly optimizing the seeding technique, it may be possible to produce a very smooth and uniform surface morphology.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which this invention pertains.

We claim:

1. A method for deposition of particles onto a substrate, the method comprising:
   (a) providing dry particles with electrostatic charges to form dry charged particles;
   (b) providing the substrate with an electrostatic potential suitable to electrostatically attract the dry charged particles;
   (c) contacting the dry charged particles with the substrate to form a particle coated substrate;
   (d) growing a polycrystalline layer on the particle coated substrate:
   wherein the particles comprise at least one selected from the group consisting of cubic boron nitride, tungsten carbide, silicon carbide, aluminum oxide, silicon nitride, yttrium-based superconductors, thallium-based superconductors, and combinations thereof, and wherein the substrate comprises at least one selected from the group consisting of silica, silicon, alumina, molybdenum, steel, silicon carbide, tungsten carbide, tungsten, silicon nitride, nickel, yttrium-based superconductors, thallium-based superconductors and combinations thereof; and
   (e) forming a crystalline layer onto the particles, wherein the crystalline layer comprises at least one selected from the group consisting of cubic boron nitride, tungsten carbide, silicon carbide, aluminum oxide, silicon nitride, and combinations thereof.

2. The method of claim 1, further comprising (f) heating the particle coated substrate to adhere the particles of the particle coated substrate to the substrate.

3. The method of claim 1, wherein the particle coated substrate comprises at least about $10^{10}$ particles per $cm^2$.

4. A method for deposition of particles onto a substrate, the method comprising:
   (a) dispersing particles into a liquid to create a dispersion;
   (b) aerosolizing the dispersion of the particles;
   (c) drying the particles to form dry particles capable of becoming electrostatically charged;
   (d) electrostatically charging the dry particles of the dispersion with electrostatic charges of one polarity to form dry charged particles;
   (e) providing the substrate with electrostatic charge suitable to electrostatically attract the dry charged particles;
   (f) contacting the dry charged particles with the substrate to form a particle coated substrate;
   (g) growing a polycrystalline layer on the particle coated substrate;
   wherein the dry particles comprise at least one selected from the group consisting of cubic boron nitride, tungsten carbide, silicon carbide, aluminum oxide, silicon nitride, yttrium-based superconductors, thallium-based superconductors, and combinations thereof, and wherein the substrate comprises at least one selected from the group consisting of silica, silicon, alumina, molybdenum, steel, silicon carbide, tungsten carbide, tungsten, silicon nitride, nickel, yttrium-based superconductors, thallium-based superconductors and combinations thereof; and
   (h) forming a crystalline layer onto the particles, wherein the crystalline layer comprises at least one selected from the group consisting of cubic boron nitride, tungsten carbide, silicon carbide, aluminum oxide, silicon nitride, and combinations thereof.

5. The method of claim 4, further comprising (i) heating the particle coated substrate to adhere the particles of the particle coated substrate to the substrate.

* * * * *

UNITED STATES PATENT AND TRADEMARK OFFICE
CERTIFICATE OF CORRECTION

PATENT NO.    : 6,544,599 B1
DATED         : April 8, 2003
INVENTOR(S)   : William D. Brown, Rajan A. Beera, Ajay P. Malshe and Hameed A. Naseem It is certified that error appears in the above-identified patent and that said Letters Patent is hereby corrected as shown below:

<u>Title page,</u>
Item [73], Assignee, should be as follows:
-- [73]  Assignee:  The Board of Trustees of the University of Arkansas
Little Rock, AR --
Item [74], *Attorney, Agent, or Firm*, should be as follows:
-- Gilbreth & Associates, P.C.
   J.M. (Mark) Gilbreth
   Mary A. Gilbreth, Ph.D. --

Signed and Sealed this

Thirtieth Day of December, 2003

JAMES E. ROGAN
*Director of the United States Patent and Trademark Office*